United States Patent [19]

Loewenhardt et al.

[11] Patent Number: 5,451,784
[45] Date of Patent: Sep. 19, 1995

[54] COMPOSITE DIAGNOSTIC WAFER FOR SEMICONDUCTOR WAFER PROCESSING SYSTEMS

[75] Inventors: Peter K. Loewenhardt, Campbell; Hiroji Hanawa, Santa Clara; Gerald Z. Yin, Cupertino, all of Calif.

[73] Assignee: Applied Materials, Inc., Santa Clara, Calif.

[21] Appl. No.: 331,836

[22] Filed: Oct. 31, 1994

[51] Int. Cl.$^6$ .................. H01J 49/48; H01J 37/244
[52] U.S. Cl. .................. 250/305; 250/397; 250/492.21
[58] Field of Search .............. 250/305, 397, 492.21

[56] References Cited

U.S. PATENT DOCUMENTS

| | | | |
|---|---|---|---|
| 4,246,479 | 1/1981 | Gopinathan | 250/305 |
| 4,494,005 | 1/1985 | Shibata et al. | 250/397 |
| 4,680,468 | 7/1987 | Bouchard et al. | 250/281 |
| 4,831,267 | 5/1989 | Brunner | 250/397 |
| 4,849,629 | 7/1989 | Daimon et al. | 250/305 |
| 4,980,562 | 12/1990 | Berrian et al. | 250/492.21 |
| 5,068,539 | 11/1991 | Nogami et al. | 250/492.21 |

OTHER PUBLICATIONS

Stenzel et al., "Novel Directional Ion Energy Analyzer", Rev. Sci. Instrum. 53(7), Jul. 1982, pp. 1027–1031.

Primary Examiner—Jack I. Berman
Attorney, Agent, or Firm—Raymond R. Moser

[57] ABSTRACT

A composite diagnostic wafer containing a placebo wafer having the same dimensions as a semiconductor wafer. The placebo wafer has affixed to one surface one or more ion current probes and one or more ion energy analyzers. As such, measurement instrumentation connected to the analyzer(s) and probe(s) determines ion current and ion energy at various locations on the placebo wafer during plasma generation within a semiconductor wafer processing system.

31 Claims, 4 Drawing Sheets

COMPOSITE DIAGNOSTIC WAFER FOR SEMICONDUCTOR WAFER PROCESSING SYSTEMS

BACKGROUND OF THE DISCLOSURE

1. Field of the Invention

The invention relates to test and measurement apparatus for semiconductor wafer processing system and, more particularly, to a composite diagnostic wafer for measuring both ion energy and ion current at various locations on the diagnostic wafer during plasma generation by a semiconductor wafer processing system.

2. Description of the Prior Art

Ion current flux and ion energy are important parameters of a plasma contained by a reaction chamber within a semiconductor processing system. These parameters define the effectiveness of the semiconductor wafer processing system in processing a wafer. Specifically, the ion current flux affects the uniformity of the etch process and indicates potential damage to a wafer. Additionally, ion energy affects selectivity of the etch, etch rate uniformity and residue control. Since these parameters are so important to the etch process, the measurement of both ion current and ion energy at a given location within the chamber is important to characterizing the effectiveness of the plasma in processing a wafer.

Typically, to measure the ion current, an ion current probe, similar to a Langmuir probe, is used. To measure the distribution of current at the surface of a wafer, one or more current probes are affixed to one surface of a placebo wafer, i.e., an anodized aluminum disk having the same size and shape as a semiconductor wafer. The placebo wafer is then positioned within a semiconductor processing system in a similar location as a semiconductor wafer would typically be located. Once a plasma is generated by the processing system, the ion current probes are biased negatively to collect ions from the plasma. Consequently, an electric current is produced in a wire attaching the probe to a current meter. The measured current is indicative of the number of ions incident upon the current probe at that location on the placebo wafer. By judiciously positioning the current probes in an array on the surface of the placebo wafer, the ion currents measured at each individual current probe are combined to estimate the ion current distribution over the surface of the placebo wafer. This current distribution is indicative of the ion current flux within the plasma.

Separately, an ion energy analyzer is generally imbedded into a support structure for the semiconductor wafer, e.g., such support structures are known as wafer chucks, susceptors, or wafer pedestals. An ion energy analyzer is a well known device for determining the energy properties of ions within a plasma. For a detailed description of an ion energy analyzer, see R. L. Stenzel et al., "Novel Directional Ion Energy Analyzer", Rev. Sci. Instrum. 53(7), July 1982, pp. 1027–1031 which is hereby incorporated by reference. As described therein, a traditional ion energy analyzer contains a metallic collector, a control grid, and a floating grid, all formed into a cylindrical stack where the collector and each grid are separated by a ceramic insulating washer. Specifically, the collector is a negatively biased metallic disk. The negative bias repels electrons from the collector and attracts ions to the collector. The control grid is positively biased such that ions with energies that do not exceed the positive bias are rejected by the analyzer. As such, the control grid is used to select ions for collection that have energy levels greater than a specified energy level and reject all others. The unbiased (floating) grid is either a mesh screen or a micro-channel plate, being unbiased, simulates the surface of a semiconductor wafer.

In operation, the ion energy analyzer imbedded in the pedestal is either used to measure the ion energy prior to having a wafer placed upon the pedestal or a specially designed wafer, having a hole to expose the energy analyzer to the plasma, is placed upon the pedestal. Once the plasma is established in the chamber, ions having energies exceeding the control grid bias are collected by the collector plate and create an electrical current in an ammeter connected to the collector plate. The energy of the ions in the plasma is determined by adjusting the control grid bias and monitoring the current measured by the ammeter.

The prior art teaches separately using current probes on a placebo wafer and an ion energy analyzer imbedded in a wafer pedestal. As such, to determine both ion current and ion energy, first the ion current is measured and then the ion energy is measured, or vice versa. Due to the necessity to conduct two sequential measurements, the duration of plasma test is much longer than each of the measurements taken singly. Furthermore, since the current and energy measurements are separated in time, such measurements can be inaccurate.

Therefore, a need exists in the art for a single diagnostic wafer combining both one or more ion current probes with one or more ion energy analyzers to facilitate substantially simultaneous ion current and energy measurement within a semiconductor wafer processing system.

SUMMARY OF THE INVENTION

The disadvantages heretofore associated with the prior art are overcome by the present invention which combines, on a single placebo wafer, one or more ion current probes with one or more ion energy analyzers.

Specifically, the present invention is a composite diagnostic wafer containing a placebo wafer fabricated of an anodized aluminum disk having substantially the same dimensions as a semiconductor wafer. The disk has affixed to one surface, or imbedded within one surface, one or more ion current probes and one or more ion energy analyzers. As such, measurement instrumentation connected to the analyzer(s) and probe(s) determines both ion current and ion energy at various locations upon the wafer. Consequently, both ion current and ion energy are measured substantially simultaneously and at substantially the same location on the placebo wafer. Thus, when using a plurality of ion current probes and ion energy analyzers upon a placebo wafer, a plasma can be fully characterized at a plurality of locations on the placebo wafer.

To provide a limiting effect to the angle of the ions accepted by the analyzers, each analyzer is optionally fitted with a micro-channel plate rather than a conventional floating grid. The thickness of the plate and the length of the channels define the geometric filtering characteristics of the plate.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
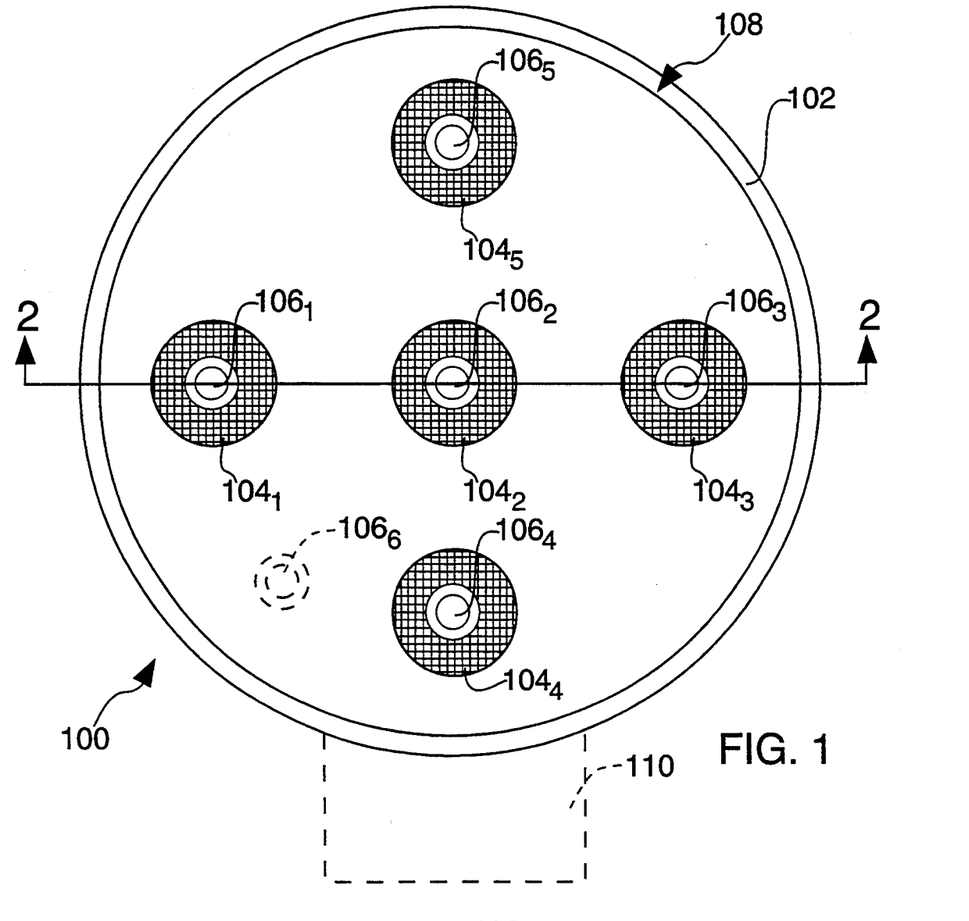
FIG. 1 depicts a top plan view of a composite diagnostic wafer in accordance with the present invention.
Figure 2:
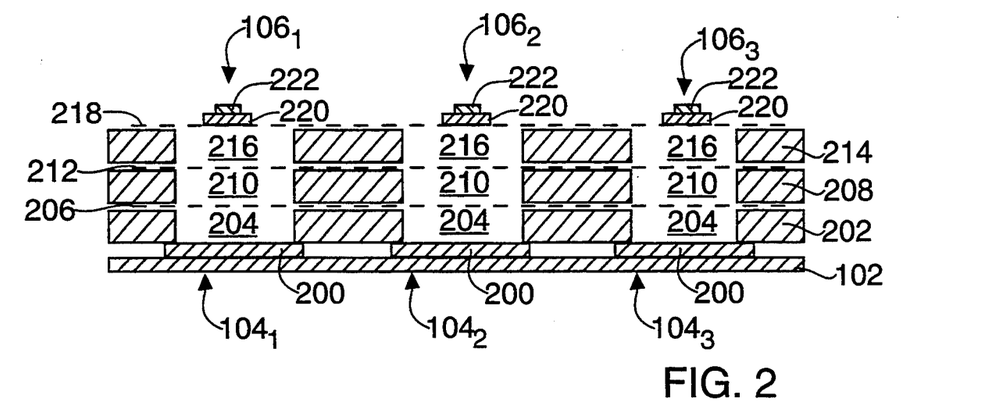
FIG. 2 depicts a cross-sectional view of a composite diagnostic wafer along line 2—2 in FIG. 1.

FIG. 1 depicts a top-plan view of a composite diagnostic wafer 100 containing placebo wafer 102 with both an ion energy analyzer $104_m$ (m being an integer value greater than or equal to 1) and an ion current probe $106_n$ (n being an integer value greater than or equal to 1) affixed to a surface of the placebo wafer. FIG. 2 is a cross-sectional view of the composite diagnostic wafer 100 along line 2—2 shown in FIG. 1. To best understand the invention, the reader should simultaneously consult both FIGS. 1 and 2.

In the illustrative embodiment, there are five analyzers $104_1$, $104_2$, $104_3$, $104_4$, and $104_5$ and five probes $106_1$, $106_2$, $106_3$, $106_4$, and $106_5$. However, those skilled in the art will certainly understand that any number of analyzers and probes, in any combination, may be used to implement the invention.

Specifically, the placebo wafer 102 is an anodized aluminum disk having dimensions equivalent to a semiconductor wafer that it replaces within a semiconductor processing system. In particular, the diameter and thickness of the placebo wafer are the same as a semiconductor wafer such that the bottom surface of the placebo wafer can be mounted to a chuck or a wafer pedestal within the processing system. The chuck then supports the placebo wafer within the processing system in a location that ensures that the placebo wafer experiences the same ion bombardment from a plasma as a semiconductor wafer would experience in that same location. As such, any measuring instrumentation attached to the placebo wafer measures the environment within the processing system as it would be generated proximate the semiconductor wafer. One illustrative semiconductor wafer processing system that can utilize the present invention is a model Centura HDP metal etch system manufactured by Applied Materials, Inc. of Santa Clara, Calif.

The placebo wafer 102 supports a plurality of energy analyzers $104_m$ and a plurality of current probes $106_n$ coaxially aligned with the energy analyzers. The analyzers and probes are positioned in an array such that the properties of the plasma can best be determined over the entire surface of the wafer. The overall height (thickness) of the composite diagnostic wafer (placebo wafer, energy analyzers and current probes) is approximately 100 to 150 mils.

Alternatively, to achieve flexibility in performing measurements, the placebo wafer may optionally contain one or more extensions or wings that extend from the circumference of the placebo wafer (one extension is shown as dashed area 110 in FIG. 1). These extensions can be used to support current probes and/or energy analyzers at locations that are outside the diameter of the wafer, e.g., at locations near the walls of the reaction chamber.

More specifically, upon the placebo wafer 102 are stacked a plurality of disk-like insulators 108, typically fabricated from a ceramic material. Each insulator is approximately 5 to 20 mils thick. In this embodiment of the invention a plurality of analyzers are fabricated by attaching, using an adhesive, a collector 200 for each analyzer 106 to the placebo wafer 102. Each collector 200 is a disk of conductive material such as tungsten or stainless steel. The collectors are individually connected by wires (not shown) to a voltage source for biasing the collectors with an adjustable negative potential.

Atop the collectors is positioned a disk-like insulator 202 containing apertures 204. Each of the apertures has a diameter that is slightly smaller than the diameter of each of the collectors. The apertures have diameters of approximately 0.2 to 0.4 inches. By resting upon the outer edge of the collector, the disk-like insulator 202 is spaced from the surface of the placebo wafer by the thickness of a collector. A secondary electron repelling grid 206, typically fabricated from a tungsten or stainless steel wire mesh or an etched nickel foil, is positioned over insulator 202. The grid has a thickness of approximately 4 mils and contains a mesh having approximately 200 lines per inch. Within each aperture the secondary electron repelling grid 206 has a parallel, spaced-apart relation to each collector 200.

Although the secondary electron repelling grid is depicted in this embodiment as well as the alternative embodiments discussed below, this grid and its supporting insulator are actually optional. Typically, the secondary electron repelling grid is only used in energy analyzers that experience high ion energies, e.g., energies greater than 10 eV. As such, the various embodiments of the invention assume that the invention is to be used in a high ion energy environment. If, however, the invention is used in a low ion energy environment, those skilled in the art will realize that the secondary electron repelling grid and its supporting insulator do not have to be incorporated into the energy analyzers.

Continuing with the embodiment depicted in FIGS. 1 and 2, another disk-like insulator 208 is stacked atop the secondary electron repelling grid 206. The insulator 208 has apertures 210 that are coaxially aligned with the apertures 204 in the insulator 202. A discriminator grid 212 (also known as a control grid) is placed atop the insulator 208. The discriminator grid is typically fabricated as a tungsten or stainless steel wire mesh or an etched nickel foil. A third disk-like insulator 214 is positioned atop the discriminator grid. The third insulator also contains apertures 216 that are coaxially aligned with the apertures 210 and 204 in insulators 208 and 202. To complete the energy analyzers $104_m$, a floating grid 218 is placed atop the third insulator 214. This grid, like the other grids, is typically fabricated of tungsten or stainless steel wire mesh or etched nickel foil and has a thickness of approximately 4 mils and a mesh size of approximately 200 lines per inch.

Physically, the stack of grids and insulators are held together by a ceramic epoxy applied between each layer. Another illustrative method of forming the stacked structure is described with respect to FIG. 6 below, wherein the grids and insulators are clamped to one another.

Electrically, the discriminator grid and the secondary electron repelling grid are connected, via wires, to voltage sources for biasing these grids to appropriate values. The typical biasing values and the overall operation of the analyzers are described below.

In the illustrative embodiment of the invention, the placement of the current probes 106 is depicted as being coaxial with the analyzers 104. However, in general, the current probes may be placed anywhere atop the annular insulator 214, e.g., as represented by current probe $106_6$, or on extension 110. As for the specific construction of each current probe, each probe contains a disk 220 of insulating material such as ceramic and a disk 222 of conductive material such as tungsten. Disk 222 is epoxied to disk 220 and disk 220 is, in turn, epoxied to floating grid 218, to the surface of the third insulator 214, or to the extension 110. A wire (not shown) connects the conductive disk 220 to instrumentation for measuring the ion current as ions impact the conductive disk. To facilitate impact of ions on the conductive disk, the disk is typically biased 80 to 100 volts more negative than the sum of the expected DC bias that accumulates on the wafer plus the amplitude of the RF voltage used to bias the chuck during plasma generation.

Figure 3:
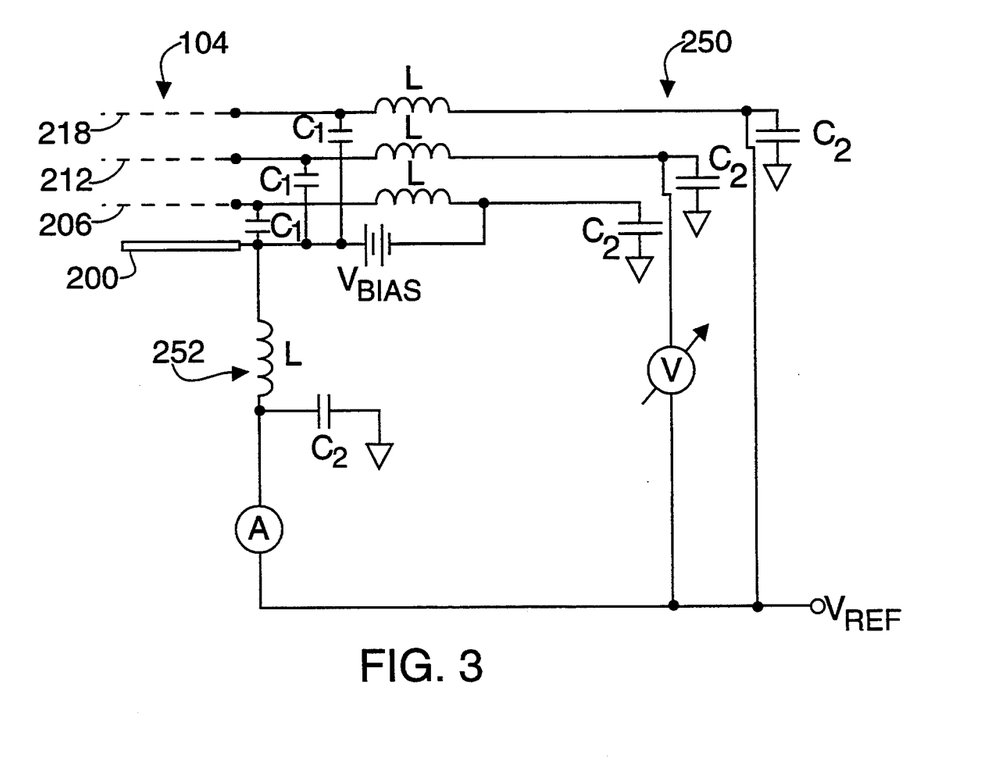
FIG. 3 is a schematic of a circuit for biasing the various grids within an ion energy analyzer.

FIG. 3 depicts a schematic drawing of a circuit 250 used to bias each of the energy analyzers $104_m$. The floating grid 218 is unbiased such that it accumulates a bias in the same manner as the surface of a semiconductor wafer accumulates a DC bias from being exposed to RF energy that biases the chuck within the reaction chamber. If, for some reason, the floating grid does not accumulate the proper bias to simulate the surface of a semiconductor wafer, a voltage $V_{REF}$ nv can be used to correctly bias the floating grid. The discriminator grid. 212 is positively biased, typically by a ramped DC voltage from voltage source V. The ramped voltage has an amplitude that begins at zero volts and ends at a voltage greater than the sum of the expected DC bias on the wafer plus the amplitude of the RF voltage used to bias the chuck. By having a swept (ramped) discriminator grid voltage, the measurement instrumentation determines an ion energy distribution. The secondary electron repelling grid 206 is biased somewhat more negative than the collector, which is generally biased to approximately $-200$ volts ($V_{BIAS}$). By having such a bias on the secondary electron repelling grid, any electrons emitted from the collector due to bombardment of the collector by ions, are repelled by grid 206 back toward the collector. Each grid is coupled through a capacitor $C_1$ to the collector to ensure that the grids are RF coupled to the collector. Each combination of inductor L and capacitor $C_2$ forms a low pass filter to block RF energy from effecting the measurement equipment (e.g., ammeter A) or the power supplies (e.g., $V_{BIAS}$, $V_{REF}$, and voltage source V).

The ions collected by the collector 200 cause an electric current in a wire connected to the collector. To determine the energy distribution of the ions, current analyzing instrumentation (e.g., ammeter A) is connected, through low pass filter 252, to the collector 200. As the voltage on the discriminator grid 212 is swept, the collector 200 is able to collect only ions with energy levels that overcome the repulsive force produced by the discriminator grid. As such, an ion energy profile can be generated for each ion energy analyzer in the diagnostic wafer. Combining the ion energy profile with the ion current information collected from the ion current probes, the composite diagnostic wafer provides significant insight into the characteristics and properties of a plasma.

Figure 4:
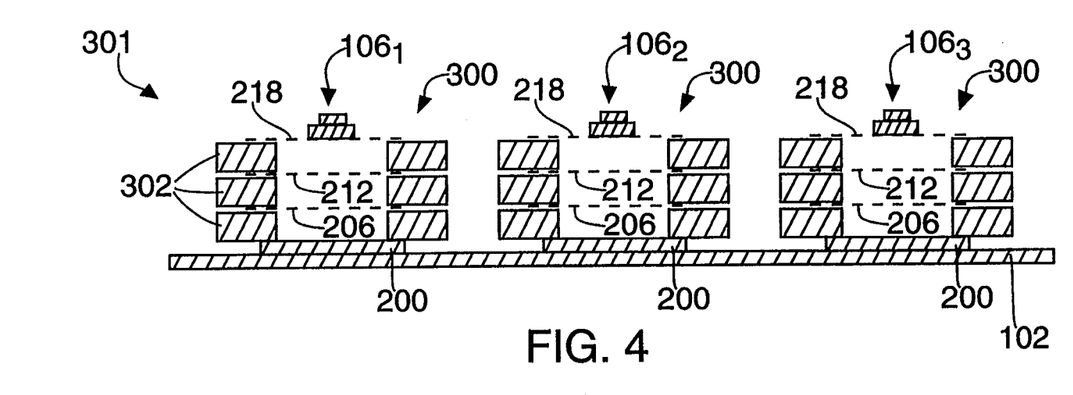
FIG. 4 depicts a cross-sectional view of a first alternative embodiment of a composite diagnostic wafer having individual ion energy analyzers positioned upon a placebo wafer.

FIG. 4 depicts a cross-sectional view of an alternative embodiment of the inventive diagnostic wafer 301 having one or more independent ion energy analyzer and ion current probe combinations 300 supported by a placebo wafer 102. Each analyzer and probe combination 300 contains three, stacked insulator washers 302 for supporting a secondary electron repelling grid 206, a discriminator grid 212, and a floating grid 218 above a collector 200. The collector is attached to a placebo wafer 102. Additionally, mounted to the center of the floating grid is a current probe 106 having a construction as described above. As with the previous embodiment, the current probes can also be placed elsewhere upon the surface of the placebo wafer without departing from the spirit of the invention.

This alternative embodiment of the invention operates in exactly the same manner as the embodiment described above. However, since the ion energy analyzers are each independently fabricated, they can be fabricated and then attached to the placebo wafer in any form of array needed to best characterize the plasma to be measured. Also, the grids of each analyzer can be independently biased to provide further flexibility in characterizing the plasma.

Figure 5:
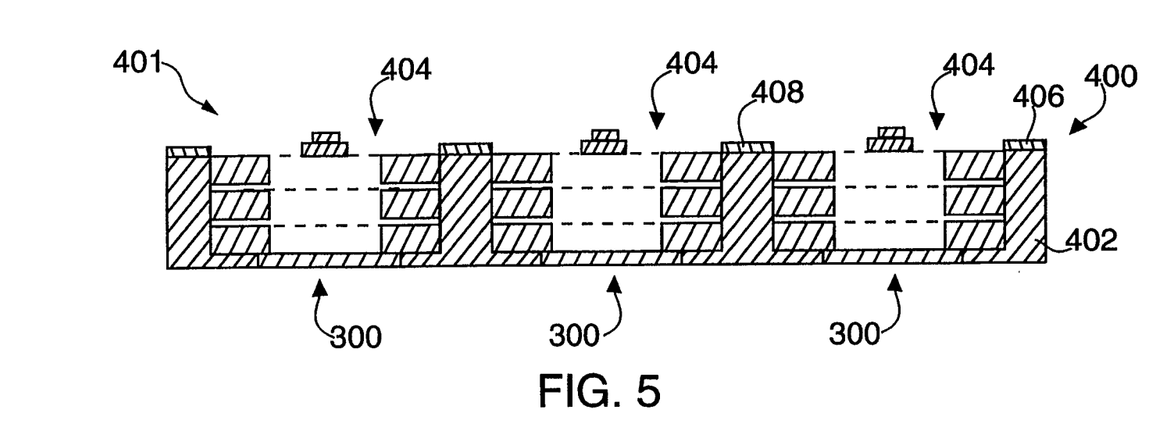
FIG. 5 depicts a cross-sectional view of a second alternative embodiment of a composite diagnostic wafer having ion energy analyzers imbedded within a "thick" placebo wafer.

FIG. 5 depicts a cross-sectional view of another (second) alternative embodiment of the inventive diagnostic wafer 401 having one or more independent ion energy analyzer and ion current probe combinations 300 imbedded within a "thick" placebo wafer 400. The ion energy analyzer and ion current probe combinations 300 are individually fabricated as described with reference to FIG. 4. In FIG. 5, the "thick" placebo wafer 400 contains a metal portion 402 having one or more apertures 404 and a ceramic (non-conductive) layer 406 deposited upon a surface 408 of the metallic portion 402. In use, the metallic portion abuts and is supported by a chuck (also known as a susceptor). In most wafer processing systems, an RF voltage is applied to the chuck as a biasing voltage. The metal portion of the placebo wafer extends the surface of the chuck. The metal portion is approximately 60 to 70 mils thick. The ceramic layer more or less imitates a semiconductor wafer resting upon the chuck. The ceramic layer is approximately 5 to 10 mils thick. In this manner, the probe combinations 300 do not protrude from the surface of the placebo wafer. In operation, the diagnostic wafer of this second alternative embodiment functions in the same manner as the first alternative embodiment described above.

Figure 6:
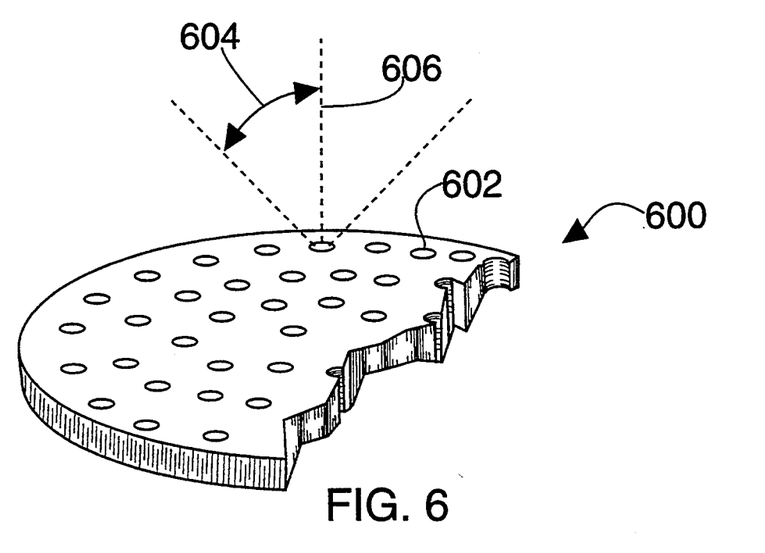
FIG. 6 depicts a micro-channel plate for a composite diagnostic wafer that forms a third alternative embodiment of the invention.

FIG. 6 depicts a partial cross sectional view of a micro-channel plate 600 that can be used in lieu of the floating grid described above. A composite diagnostic wafer having one or more ion energy analyzers with micro-channel plates forms a third embodiment of the invention. Such an ion energy analyzer having a micro-channel plate can be used in any of the foregoing embodiments of the invention. In comparison to a floating grid, a micro-channel plate 600 provides depth to each passageway into the ion energy analyzer and, as such, provides ion trajectory discrimination, i.e., the thicker the plate, the more geometrically discriminating the analyzer and the narrower the angle over which incoming ions will be accepted into the analyzer.

The plate 600 is typically fabricated of glass having a plurality of holes 602 (or micro-channels) formed in a honeycomb pattern through the plate. Using such a micro-channel plate provides a trajectory discrimination scheme also known as a geometric filter. In particular, the plate thickness and micro-channel diameter define a critical angle 604 measured from the long axis 606 of a given micro-channel 602. Ions entering a micro-channel at a trajectory angle that is greater than the critical angle impact the walls of the micro-channel and do not enter the ion energy analyzer. On the other hand, ions with trajectory angles less than the critical angle pass into the analyzer for further discrimination (energy discrimination) by the discriminator grid. In one prior art utilization of a micro-channel plate in an ion energy analyzer, the holes had a diameter of 0.015 mm and a length of 0.6 mm which defined a critical angle of approximately 0.6 degrees. See R. L. Stenzel et al., "Novel Directional Ion Energy Analyzer", Rev. Sci. Instrum. 53(7), July 1982, pp. 1027–1031. Of course, for cylindrical holes, the critical angle is a spherical angle. Optionally, the micro-channels can be formed at an angle to the plane of the plate such that ions having certain trajectory angles plus or minus the critical angle are selected for measurement.

Figure 7:
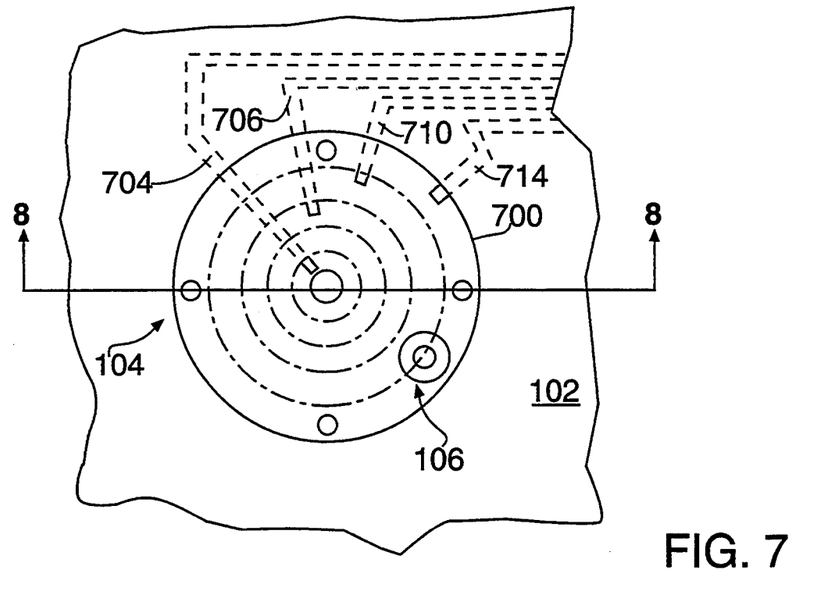
FIG. 7 depicts a top plan view of a fourth alternative embodiment of the present invention.
Figure 8:
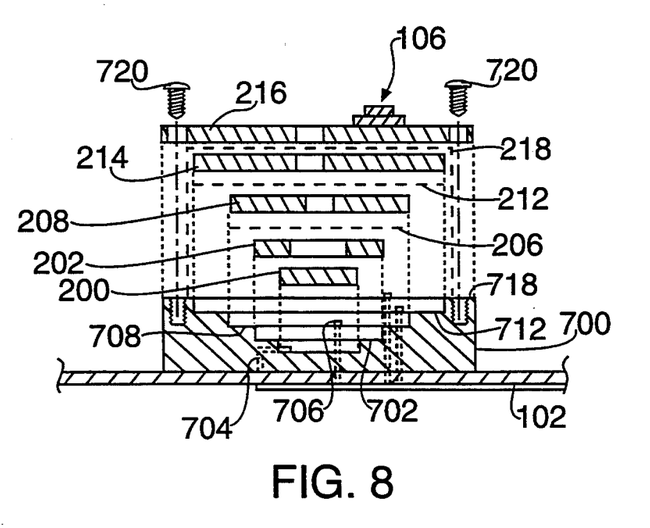
FIG. 8 depicts a cross-sectional view of the alternative embodiment of the present invention along line 8—8 depicted in FIG. 7.

FIG. 7 depicts a top plan view of a fourth alternative embodiment of the present invention. FIG. 8 depicts an exploded, cross-sectional view along line 8—8 shown in FIG. 7. To best understand this embodiment, FIGS. 7 and 8 should be viewed simultaneously.

FIGS. 7 and 8 depict a composite diagnostic wafer containing an ion energy analyzer 104 and current probe 106 mounted upon a placebo wafer 102. The analyzer component parts are clamped together, rather than epoxied, to form a structurally sturdy analyzer device. Specifically, a housing 700 of the analyzer 104 is attached to, or imbedded within, a placebo wafer 102. The housing 700 has a terraced inner surface and a substantially cylindrical outer surface. The housing is constructed of a solid anodized aluminum cylinder having the terraced inner surface milled therein. To provide electrical access to the grids, holes are drilled from the outer surface to the inner surface of the housing through which wires are threaded. Alternatively, the housing can be formed of a stack of anodized aluminum washers. A conductive trace and conductive through-hole can be formed on each washer prior to stacking. Once stacked, the washers can be welded, fused, or screwed to one another. The conductive traces and through holes provide an electrical path to the components of the analyzer.

Once housing 700 is formed, the collector disk 200 is positioned within the housing. The collector abuts conductive trace 704 such that current measuring instrumentation can be connected to the collector. Atop the collector and supported by the first terrace 702 is positioned annular insulator 202. Atop insulator 202 is positioned the secondary electron repelling grid 206. The grid 206 abuts a conductive trace 706 located on terrace 708 that supplies bias voltage to the grid. The second annular insulator 208 is positioned upon terrace 708. The discriminator grid 212 is positioned atop insulator 208 and abuts conductive trace 710 located on terrace 712. The third annular insulator 214 is positioned above grid 212 and is supported by terrace 712. The floating grid 218 is located on the top surface 718 of the housing 700 and abuts conductive trace 714. A clamping ring 716 is screwed, by screws 720, to the top surface 718 of the housing 700. The clamping ring maintains, by compressive force, the insulators and grids within the analyzer in a stationary position. Additionally, the compressive force maintains the grids in electrical contact with their respective conductive traces. Lastly, a current probe 106 is attached, typically by a ceramic epoxy, to the top surface of the clamping ring 716. This ion energy analyzer and current probe combination operates in the exact same manner as the combinations described with respect to the other embodiments of the invention.

Alternatively, the walls of the apertures in the "thick" placebo wafer of FIG. 5 can be terraced in the manner described above. As such, an ion energy analyzer can be fabricated within each of the terraced apertures as described above.

To fully characterize a plasma within a reaction chamber, each of the foregoing embodiments of the invention are able to substantially simultaneously measure both ion current and ion energy. Furthermore, both measurements can be accomplished at generally the same physical location on the placebo wafer. Thus, by using a plurality of ion probe and ion energy analyzer combinations distributed over the surface of a placebo wafer, two-dimensional ion current and ion energy maps can be generated to fully characterize a plasma over the surface of the placebo wafer.

Although various embodiments which incorporate the teachings of the present invention have been shown and described in detail herein, those skilled in the art can readily devise many other varied embodiments that still incorporate these teachings.

What is claimed is:

1. A diagnostic wafer comprising:
   a placebo wafer;
   an ion current probe mounted upon said placebo wafer; and
   an ion energy analyzer mounted upon said placebo wafer.

2. The diagnostic wafer of claim 1 further comprising a plurality of ion current probes mounted upon said placebo wafer.

3. The diagnostic wafer of claim 1 further comprising a plurality of ion energy analyzers mounted upon said placebo wafer.

4. The diagnostic wafer of claim 1 wherein said placebo wafer further comprises at least one extension extending from a circumference of said placebo wafer.

5. The diagnostic wafer of claim 1 wherein said ion current probe is coaxially mounted to said ion energy analyzer and said ion energy analyzer is mounted to said placebo wafer.

6. The diagnostic wafer of claim 1 wherein said ion current probe and said ion energy analyzer are substantially co-located upon the placebo wafer.

7. The diagnostic wafer of claim 1 wherein said energy analyzer further comprises:
   a collector plate mounted to said placebo wafer;
   a discriminator grid annular insulator, attached to said collector plate, having a central aperture aligned with a center of said collector plate;

a discriminator grid, attached to said discriminator grid annular insulator, spanning said central aperture thereof and spaced apart from said collector plate;

a floating grid annular insulator, attached to said discriminator grid, having a central aperture aligned with a center of said central aperture of said discriminator grid annular insulator; and a floating grid, attached to said floating grid annular insulator, spanning said central aperture thereof and spaced apart from said discriminator grid.

8. The diagnostic wafer of claim 7 wherein said energy analyzer further comprises:

a secondary electron repelling grid annular insulator, located between said collector plate and said discriminator grid annular insulator, having a central aperture aligned with a center of said central aperture of said discriminator grid annular insulator; and a secondary electron repelling grid, attached to said secondary electron repelling grid annular insulator, spanning said central aperture thereof and spaced apart from said collector plate.

9. The diagnostic wafer of claim 7 having an ion current probe attached to said floating grid.

10. The diagnostic wafer of claim 7 wherein said floating grid is a micro-channel plate.

11. The diagnostic wafer of claim 7, wherein said energy analyzer is formed within a housing having a terraced inner surface, where said discriminator grid annular insulator is supported atop the collector by a first terrace, said discriminator grid and said floating grid annular insulator are supported by a second terrace, said floating grid is supported by a top surface of the housing, and a clamping ring is attached to said top surface of said housing to clamp said collector, said discriminator grid annular insulator, said discriminator grid, said floating grid annular insulator, and said floating grid within said housing.

12. The diagnostic wafer of claim 8, wherein said energy analyzer is formed within a housing having a terraced inner surface, where said secondary electron repelling grid annular insulator is supported atop the collector by a first terrace, said secondary electron repelling grid and said discriminator grid annular insulator are supported by a second terrace, said discriminator grid and said floating grid annular insulator are supported by a third terrace, said floating grid is supported by a top surface of the housing, and a clamping ring is attached to said top surface of said housing to clamp said collector, secondary electron repelling grid annular insulator, said secondary electron repelling grid, said discriminator grid annular insulator, said discriminator grid, said floating grid annular insulator, and said floating grid within said housing.

13. The diagnostic wafer of claim 11, wherein a plurality of conductive traces are connected through said housing to said collector, said discriminator grid and said floating grid.

14. The diagnostic wafer of claim 12, wherein a plurality of conductive traces are connected through said housing to said collector, said secondary electron repelling grid, said discriminator grid and said floating grid.

15. A diagnostic wafer comprising:

a placebo wafer having an aperture formed therein;

an ion energy analyzer;

an ion current probe;

said analyzer and probe being supported by said placebo wafer substantially in registration with said aperture.

16. The diagnostic wafer of claim 15 wherein said ion energy analyzer is positioned within said aperture.

17. The diagnostic wafer of claim 15 wherein said ion current probe is substantially co-located with said ion energy analyzer.

18. The diagnostic wafer of claim 15 wherein said ion current probe is attached to said ion energy analyzer.

19. The diagnostic wafer of claim 15 wherein said placebo wafer further comprises a conductive portion and an insulating layer formed over a surface of said conductive portion.

20. The diagnostic wafer of claim 15 wherein said placebo wafer contains a plurality of apertures and each aperture contains an ion energy analyzer.

21. The diagnostic wafer of claim 15 wherein said placebo wafer supports a plurality of ion current probes.

22. The diagnostic wafer of claim 18 wherein said ion current probe is coaxially mounted to said ion energy analyzer and said ion energy analyzer is positioned within said aperture.

23. The diagnostic wafer of claim 15 wherein said placebo wafer further comprises at least one extension extending from a circumference of said placebo wafer.

24. The diagnostic wafer of claim 15 wherein said energy analyzer further comprises:

a collector plate mounted within said aperture in said placebo wafer;

a discriminator grid annular insulator, attached to said collector plate, having a central aperture aligned with a center of said collector plate;

a discriminator grid, attached to said discriminator grid annular insulator, spanning said central aperture thereof and spaced apart from said collector plate;

a floating grid annular insulator, attached to said discriminator grid, having a central aperture aligned with a center of said central aperture of said discriminator grid annular insulator; and a floating grid, attached to said floating grid annular insulator, spanning said central aperture thereof and spaced apart from said discriminator grid.

25. The diagnostic wafer of claim 24 wherein said energy analyzer further comprises:

a secondary electron repelling grid annular insulator, located between said collector plate and said discriminator grid annular insulator, having a central aperture aligned with a center of said central aperture of said discriminator grid annular insulator; and a secondary electron repelling grid, attached to said secondary electron repelling grid annular insulator, spanning said central aperture thereof and spaced apart from said collector plate.

26. The diagnostic wafer of claim 24 having an ion current probe attached to said floating grid.

27. The diagnostic wafer of claim 24 wherein said floating grid is a micro-channel plate.

28. The diagnostic wafer of claim 24, wherein said aperture in said placebo wafer has a terraced inner surface and said energy analyzer is formed upon said terraced inner surface, where said discriminator grid annular insulator is supported atop the collector by a first terrace, said discriminator grid and said floating grid annular insulator are supported by a second terrace, said floating grid is supported by a top surface of the housing, and a clamping ring is attached to said top surface of said housing to clamp said collector, said discriminator grid annular insulator, said discriminator grid, said floating grid annular insulator, and said floating grid within said housing.

29. The diagnostic wafer of claim 25, wherein said aperture in said placebo wafer has a terraced inner surface and said energy analyzer is formed upon said terraced inner surface, where said secondary electron repelling grid annular insulator is supported atop the collector by a first terrace, said secondary electron repelling grid and said discriminator grid annular insulator are supported by a second terrace, said discriminator grid and said floating grid annular insulator are supported by a third terrace, said floating grid is supported by a top surface of the housing, and a clamping ring is attached to said top surface of said housing to clamp said collector, secondary electron repelling grid annular insulator, said secondary electron repelling grid, said discriminator grid annular insulator, said discriminator grid, said floating grid annular insulator, and said floating grid within said housing.

30. The diagnostic wafer of claim 28, wherein a plurality of conductive traces are connected through said housing to said collector, said discriminator grid and said floating grid.

31. The diagnostic wafer of claim 29, wherein a plurality of conductive traces are connected through said housing to said collector, said secondary electron repelling grid, said discriminator grid and said floating grid.

* * * * *